US009524913B2

(12) United States Patent
Torikoshi et al.

(10) Patent No.: US 9,524,913 B2
(45) Date of Patent: Dec. 20, 2016

(54) POLISHING METHOD AND POLISHING APPARATUS

(71) Applicant: EBARA CORPORATION, Tokyo (JP)

(72) Inventors: Tsuneo Torikoshi, Tokyo (JP); Hirofumi Otaki, Tokyo (JP)

(73) Assignee: Ebara Corporation, Tokyo (JP)

(*) Notice: Subject to any disclaimer, the term of this patent is extended or adjusted under 35 U.S.C. 154(b) by 0 days.

(21) Appl. No.: 14/602,254

(22) Filed: Jan. 21, 2015

(65) Prior Publication Data

US 2015/0221562 A1 Aug. 6, 2015

(30) Foreign Application Priority Data

Jan. 23, 2014 (JP) .................................. 2014-010800

(51) Int. Cl.
| | |
|---|---|
| H01L 21/66 | (2006.01) |
| H01L 21/67 | (2006.01) |
| B24B 49/00 | (2012.01) |
| B24B 37/04 | (2012.01) |
| H01L 21/306 | (2006.01) |
| B24B 49/16 | (2006.01) |
| B24B 37/013 | (2012.01) |

(52) U.S. Cl.
CPC ............ *H01L 22/12* (2013.01); *B24B 37/042* (2013.01); *B24B 49/00* (2013.01); *H01L 21/67219* (2013.01); *H01L 21/67253* (2013.01); *B24B 37/013* (2013.01); *B24B 49/16* (2013.01); *H01L 21/30625* (2013.01)

(58) Field of Classification Search
CPC ............... H01L 22/12; H01L 21/67219; H01L 21/67253; H01L 21/30625; B24B 49/00; B24B 37/042; B24B 49/16; B24B 37/013
See application file for complete search history.

(56) References Cited

U.S. PATENT DOCUMENTS

| | | | | |
|---|---|---|---|---|
| 5,885,138 A | * | 3/1999 | Okumura .................. | B08B 1/04 451/285 |
| 6,447,370 B1 | * | 9/2002 | Weldon ............. | H01L 21/67161 451/41 |
| 7,097,534 B1 | * | 8/2006 | Yampolskiy ............ | B24B 49/02 451/28 |
| 7,118,451 B2 | * | 10/2006 | Chen ....................... | B24B 21/04 451/10 |
| 2006/0194511 A1 | * | 8/2006 | Nagayama .............. | B24B 37/08 451/5 |
| 2014/0141694 A1 | * | 5/2014 | Zhang ..................... | B24B 49/12 451/5 |

FOREIGN PATENT DOCUMENTS

JP 2009-274139 11/2009

* cited by examiner

*Primary Examiner* — Anita Alanko
(74) *Attorney, Agent, or Firm* — Baker & Hostetler LLP

(57) ABSTRACT

A polishing method and a polishing apparatus for performing a measurement of a film thickness of a substrate, such as a wafer, if an error has occurred during polishing of the substrate. The polishing method includes polishing a plurality of substrates, measuring a film thickness of at least one substrate, which has been designated in advance, of the plurality of substrates that have been polished, and if a polishing error has occurred during polishing of any one of the plurality of substrates, measuring a film thickness of that substrate.

12 Claims, 5 Drawing Sheets

FIG. 4

| WAFER NUMBER | DESIGNATION TYPE |
|---|---|
| 1 | PRE-MEASUREMENT WAFER & POST-MEASUREMENT WAFER |
| 2 | POST-MEASUREMENT WAFER |
| 3 | NON-MEASUREMENT WAFER |
| 4 | NON-MEASUREMENT WAFER |
| 5 | NON-MEASUREMENT WAFER |
| 6 | PRE-MEASUREMENT WAFER & POST-MEASUREMENT WAFER |
| 7 | POST-MEASUREMENT WAFER |
| 8 | NON-MEASUREMENT WAFER |
| 9 | NON-MEASUREMENT WAFER |
| 10 | NON-MEASUREMENT WAFER |
| 11 | PRE-MEASUREMENT WAFER & POST-MEASUREMENT WAFER |
| 12 | POST-MEASUREMENT WAFER |
| 13 | NON-MEASUREMENT WAFER |
| 14 | NON-MEASUREMENT WAFER |
| 15 | NON-MEASUREMENT WAFER |
| 16 | PRE-MEASUREMENT WAFER & POST-MEASUREMENT WAFER |
| 17 | POST-MEASUREMENT WAFER |
| 18 | NON-MEASUREMENT WAFER |
| 19 | NON-MEASUREMENT WAFER |
| 20 | NON-MEASUREMENT WAFER |
| 21 | PRE-MEASUREMENT WAFER & POST-MEASUREMENT WAFER |
| 22 | POST-MEASUREMENT WAFER |
| 23 | NON-MEASUREMENT WAFER |
| 24 | NON-MEASUREMENT WAFER |
| 25 | NON-MEASUREMENT WAFER |

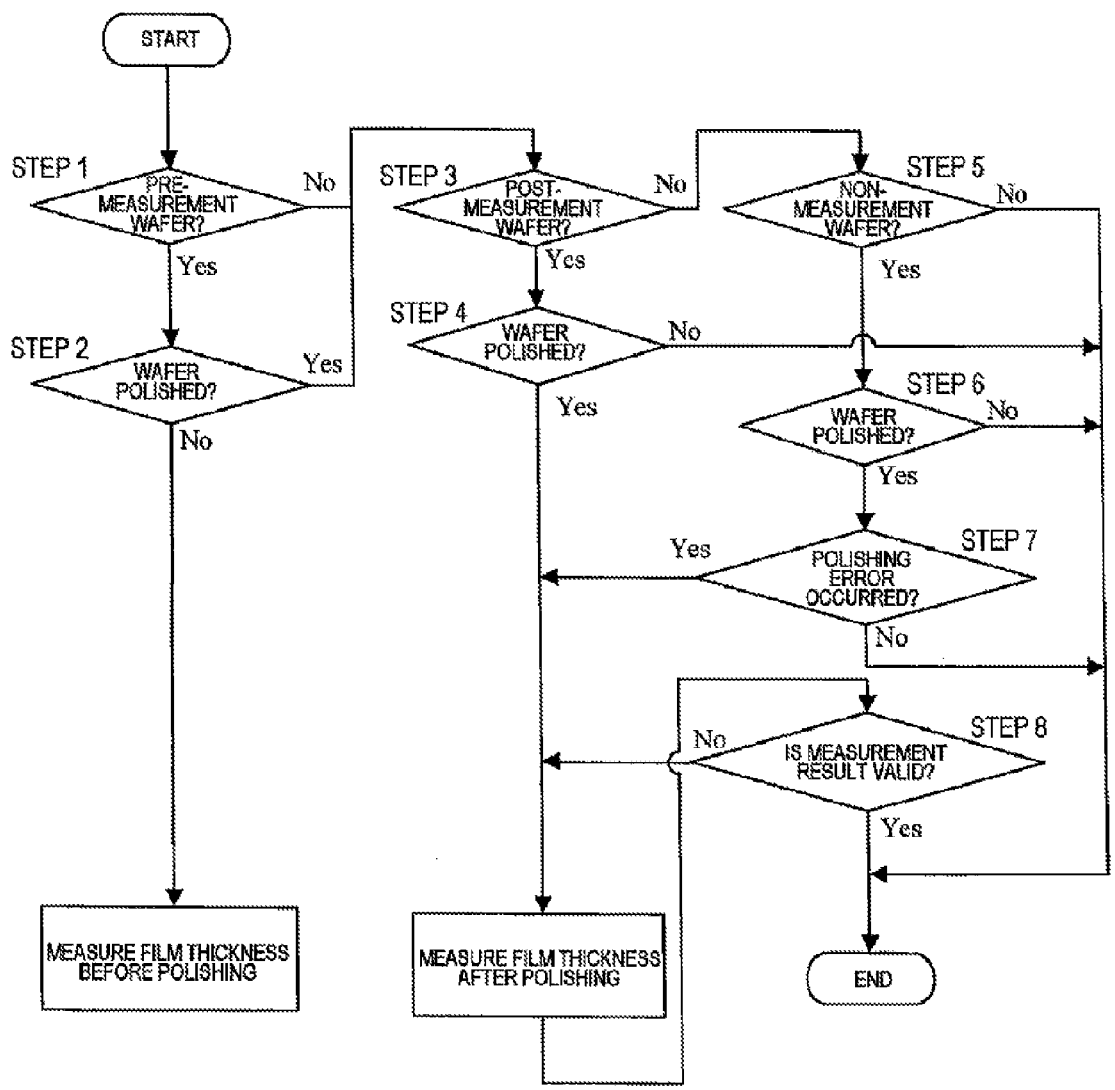

POLISHING METHOD AND POLISHING APPARATUS

CROSS REFERENCE TO RELATED APPLICATION

This document claims priority to Japanese Patent Application Number 2014-010800 filed Jan. 23, 2014, the entire contents of which are hereby incorporated by reference.

BACKGROUND OF THE INVENTION

In a manufacturing facility for semiconductor devices, there is a demand for improvement of a throughput for the purpose of increasing an operation rate of a polishing apparatus. The polishing apparatus includes a film-thickness measuring device for measuring a film thickness of a polished wafer in order to judge whether or not the wafer has been properly polished. Of all wafers, only some wafers, which have been designated in advance, are subjected to the film-thickness measurement, because it takes a certain time to measure the film thickness. For example, only a first wafer, a fifth wafer, and a tenth wafer are transported to the film-thickness measuring device, where the film thickness is measured.

In leading-edge processes of manufacturing semiconductor devices, improvement of a yield is also an important issue. From this viewpoint, if an error has occurred when a wafer is being polished, it is required to re-polish that wafer in order to avoid scrapping of that wafer. Thus, film-thickness measurement data is used as an index for judging whether or not re-polishing of the wafer is necessary.

However, as described above, the film-thickness measurement is performed only on some wafers that have been designated in advance. An error can occur during polishing of a wafer that is not one of the designated wafers. In such a case, the film-thickness measurement data of the error wafer cannot be obtained, and as a result, it is not possible to judge whether or not re-polishing of the error wafer should be performed.

SUMMARY OF THE INVENTION

According to embodiments, there are provided a polishing method and a polishing apparatus for performing a measurement of a film thickness of a substrate, such as a wafer, if an error has occurred during polishing of the substrate.

Embodiments, which will be described below, relate to a polishing method and a polishing apparatus for polishing a substrate, such as a wafer, and more particularly to a polishing method and a polishing apparatus that performs a measurement of a film thickness of a substrate after polishing of the substrate.

In an embodiment, there is provided a polishing method comprising: polishing a plurality of substrates; measuring a film thickness of at least one substrate, which has been designated in advance, of the plurality of substrates that have been polished; and if a polishing error has occurred during polishing of any one of the plurality of substrates, measuring a film thickness of that substrate.

In an embodiment, the polishing method further comprises: cleaning the plurality of substrates that have been polished; and drying the plurality of substrates that have been cleaned.

In an embodiment, if the polishing error has occurred during polishing of any one of the plurality of substrates, measuring of the film thickness of that substrate is performed after polishing of that substrate.

In an embodiment, whether or not the polishing error has occurred is judged after a substrate is polished.

In an embodiment, there is provided a polishing apparatus comprising: a polishing unit configured to polish a substrate; a film-thickness measuring device configured to measure a film thickness of the substrate that has been polished; and a transporting device configured to transport a plurality of substrates successively to the polishing unit, and further transport at least one substrate, which has been designated in advance, of the plurality of substrates that have been polished to the film-thickness measuring device, the transporting device being configured to, if a polishing error has occurred during polishing of any one of the plurality of substrates, transport that substrate to the film-thickness measuring device.

In an embodiment, the polishing apparatus further comprises: a cleaning unit configured to clean a substrate; and a drying unit configured to dry a substrate.

According to the above-described embodiments, even if a polishing error has occurred during polishing of a substrate that is not designated as a substrate whose film thickness is to be measured after polishing, a film thickness of that substrate is measured. Therefore, whether re-polishing of the substrate is necessary or not can be judged from film-thickness measurement data obtained. As a result, scrapping of the substrate can be avoided.

BRIEF DESCRIPTION OF THE DRAWINGS

FIG. 4 is a diagram showing wafer numbers of respective wafers stored in the substrate cassette, and a designation status of each of the wafers with respect to film-thickness measurement; and FIG. 5 is a diagram showing a wafer processing flow that varies in accordance with the designation status of the wafer.

DESCRIPTION OF EMBODIMENTS

Figure 1:
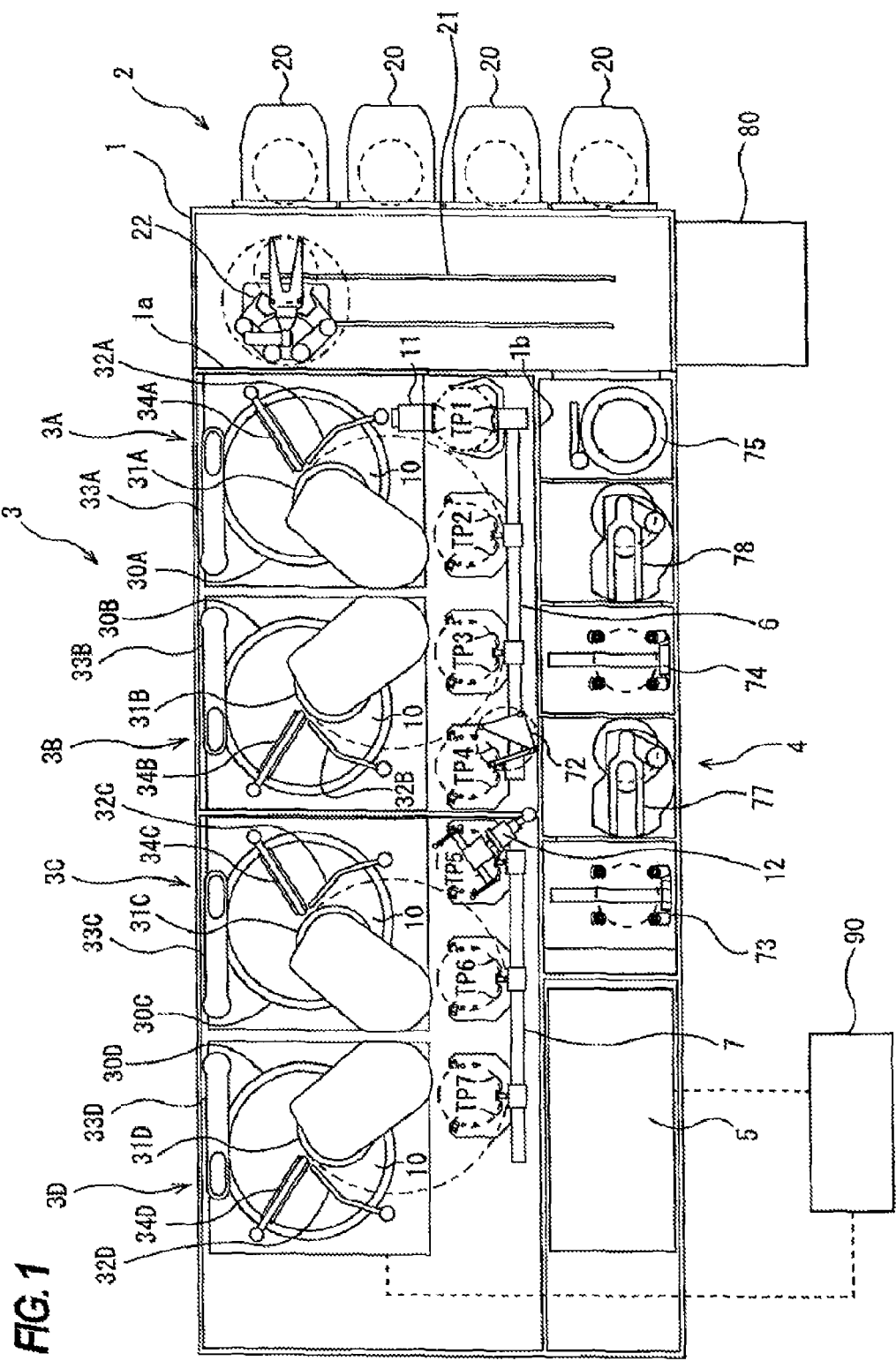
FIG. 1 is a view showing a polishing apparatus according to an embodiment.

Embodiments will be described with reference to the drawings. FIG. 1 is a view showing a polishing apparatus according to an embodiment. As shown in FIG. 1, this polishing apparatus has a housing 1 in approximately a rectangular shape. An interior space of the housing 1 is divided by partitions 1a and 1b into a load-unload section 2, a polishing section 3, and a cleaning section 4. The polishing apparatus includes an operation controller 5 configured to control wafer processing operations.

The load-unload section 2 has front load sections 20 on which substrate cassettes are placed, respectively. A plurality of wafers (substrates) are stored in each substrate cassette. The load-unload section 2 has a moving mechanism 21 extending along an arrangement direction of the front load sections 20. A transfer robot (loader) 22 is provided on the moving mechanism 21, so that the transfer robot 22 can move along the arrangement direction of the substrate cassettes. The transfer robot 22 moves on the moving mechanism 21 so as to be able to access the substrate cassettes mounted to the front load sections 22.

The polishing section 3 is an area where a wafer is polished. This polishing section 3 includes a first polishing unit 3A, a second polishing unit 3B, a third polishing unit 3C, and a fourth polishing unit 3D. As shown in FIG. 1, the first polishing unit 3A includes a first polishing table 30A to which a polishing pad 10, having a polishing surface, is attached, a first top ring 31A for holding a wafer and pressing the wafer against the polishing pad 10 on the first polishing table 30A so as to polish the wafer, a first polishing liquid supply nozzle 32A for supplying a polishing liquid (e.g., slurry) and a dressing liquid (e.g., pure water) onto the polishing pad 10, a first dresser 33A for dressing the polishing surface of the polishing pad 10, and a first atomizer 34A for ejecting a mixture of a liquid (e.g., pure water) and a gas (e.g., nitrogen gas) in an atomized state, onto the polishing surface.

Similarly, the second polishing unit 3B includes a second polishing table 30B to which a polishing pad 10 is attached, a second top ring 31B, a second polishing liquid supply nozzle 32B, a second dresser 33B, and a second atomizer 34B. The third polishing unit 3C includes a third polishing table 30C to which a polishing pad 10 is attached, a third top ring 31C, a third polishing liquid supply nozzle 32C, a third dresser 33C, and a third atomizer 34C. The fourth polishing unit 3D includes a fourth polishing table 30D to which a polishing pad 10 is attached, a fourth top ring 31D, a fourth polishing liquid supply nozzle 32D, a fourth dresser 33D, and a fourth atomizer 34D.

Figure 2:
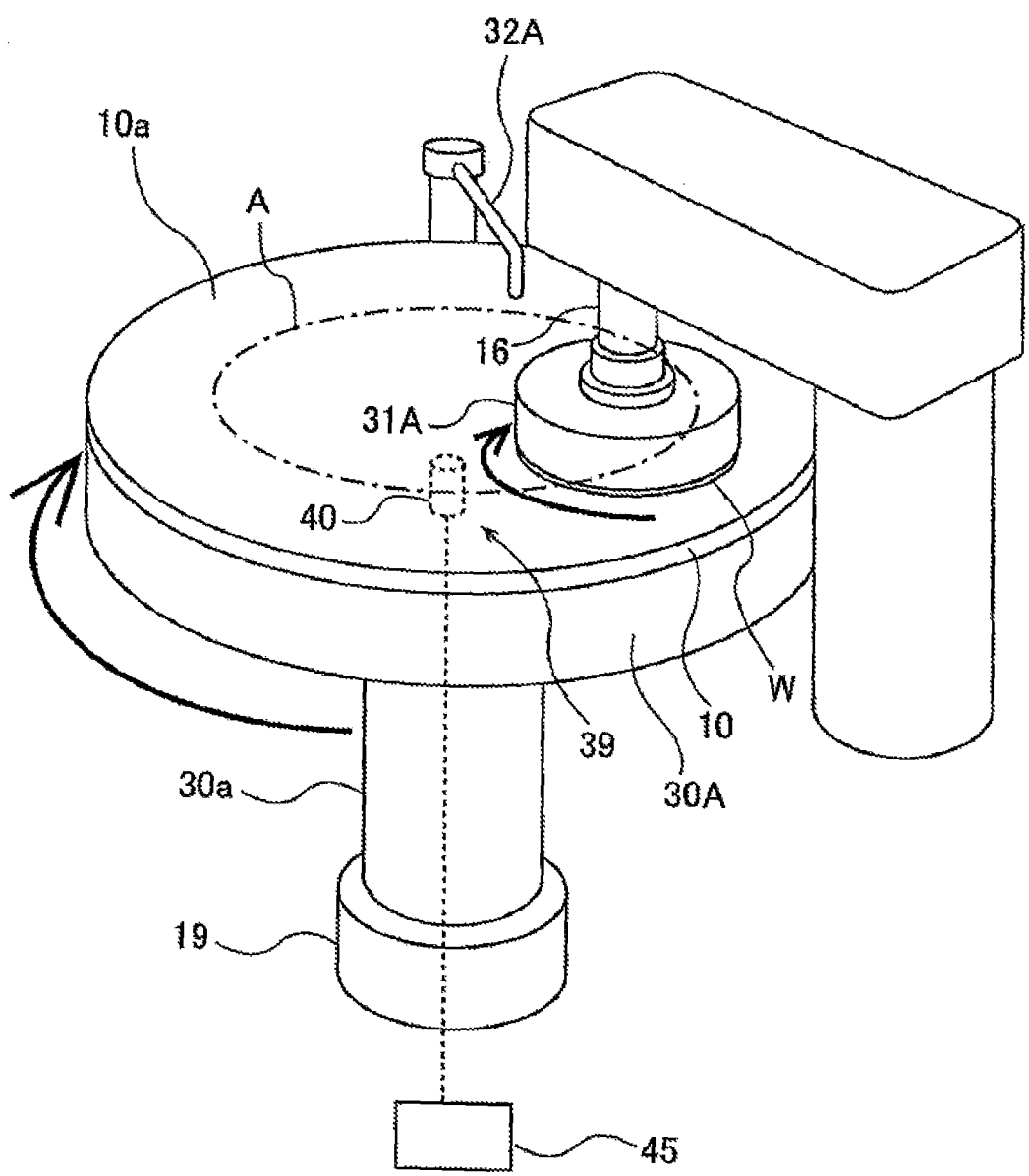
FIG. 2 is a perspective view schematically showing a first polishing unit.

The first polishing unit 3A, the second polishing unit 3B, the third polishing unit 3C, and the fourth polishing unit 31) have the same configuration. Therefore, the first polishing unit 3A will be described below with reference to FIG. 2. FIG. 2 is a perspective view schematically showing the first polishing unit 3A. In FIG. 2, the dresser 33A and the atomizer 34A are omitted.

The polishing table 30A is coupled to a table motor 19 through a table shaft 30a, so that the polishing table 30A is rotated by the table motor 19 in a direction indicated by arrow. The table motor 19 is located below the polishing table 30A. The polishing pad 10 is attached to an upper surface of the polishing table 30A. The polishing pad 10 has an upper surface 10a, which provides a polishing surface for polishing the wafer W. The top ring 31A is secured to a lower end of a top ring shaft 16. The top ring 31A is configured to hold the wafer W on its lower surface by vacuum suction. The top ring shaft 16 is elevated and lowered by an elevating mechanism (not shown in the drawing).

The first polishing unit 3A has a polishing end point detection device 39 for detecting a polishing end point of the wafer W. This polishing end point detection device 39 has a film-thickness sensor 40 configured to obtain a film-thickness signal that varies in accordance with a film thickness of the wafer W, and a film-thickness monitoring unit 45 configured to determine the polishing end point from the film-thickness signal. The film-thickness sensor 40 is located in the polishing table 30A. The film-thickness sensor 40 is rotated together with the polishing table 30A as illustrated by symbol "A" and obtains the film-thickness signal of the wafer W held by the top ring 31A. The film-thickness sensor 40 is coupled to the film-thickness monitoring unit 45 so that the film-thickness signal obtained by the film thickness sensor 40 is transmitted to the film-thickness monitoring unit 45. The film-thickness monitoring unit 45 determines the polishing end point at which the film-thickness signal reaches a preset target value.

Polishing of the wafer W is performed as follows. The top ring 31A and the polishing table 30A are rotated in directions as indicated by arrows, while the polishing liquid (i.e., the slurry) is supplied onto the polishing pad 10 from the polishing liquid supply nozzle 32A. In this state, the top ring 31A presses the wafer W against the polishing surface 10a of the polishing pad 10. The surface of the wafer W is polished by a mechanical action of abrasive grains contained in the polishing liquid and a chemical action of the polishing liquid. After polishing of the wafer W, dressing (or conditioning) of the polishing surface 10a is performed by the dresser 33A. Further, high-pressure fluid is supplied from the atomizer 34A onto the polishing surface 10a to remove polishing debris and the abrasive grains remaining on the polishing surface 10a.

Referring back to FIG. 1, a first linear transporter 6 is arranged adjacent to the first polishing unit 3A and the second polishing unit 3B. This first linear transporter 6 is configured to transport the wafer between four transfer positions (i.e., a first transfer position TP1, a second transfer position TP2, a third transfer position TP3, and a fourth transfer position TP4). A second linear transporter 7 is arranged adjacent to the third polishing unit 3C and the fourth polishing unit 3D. This second linear transporter 7 is configured to transport the wafer between three transfer positions (i.e., a fifth transfer position TP5, a sixth transfer position TP6, and a seventh transfer position TP7).

The wafer is transported to the polishing units 3A and 3B by the first linear transporter 6. The top ring 31A of the first polishing unit 3A is moved between a position above the polishing table 30A and the second transfer position. TP2 by the swinging motion of the top ring 31A. Therefore, transferring of the wafer between the top ring 31A and the first linear transporter 6 is performed at the second transfer position TP2.

Similarly, the top ring 31B of the second polishing unit 3B is moved between a position above the polishing table 30B and the third transfer position TP3, and transferring of the wafer between the top ring 31B and the first linear transporter 6 is performed at the third transfer position TP3. The top ring 31C of the third polishing unit 3C is moved between a position above the polishing table 30C and the sixth transfer position TP6, and transferring of the wafer between the top ring 31 and the second linear transporter 7 is performed at the sixth transfer position TP6. The top ring 31D of the fourth polishing unit 3D is moved between a position above the polishing table 30D and the seventh transfer position TP7, and transferring of the wafer between the top ring 31D and the second linear transporter 7 is performed at the seventh transfer position TP7.

A lifter 11 for receiving the wafer from the transfer robot 22 is provided adjacent to the first transfer position TP1. The wafer is transported from the transfer robot 22 to the first linear transporter 6 via the lifter 11. A shutter (not shown in the drawing) is provided on the partition 1a at a position between the lifter 11 and the transfer robot 22. When the wafer is to be transported, this shutter is opened to allow the transfer robot 22 to deliver the wafer to the lifter 11.

A swing transporter 12 is provided between the first linear transporter 6, the second linear transporter 7, and the cleaning section 4. Transporting of the wafer from the first linear transporter 6 to the second linear transporter 7 is performed by the swing transporter 12. The wafer is transported to the third polishing unit 3C and/or the fourth polishing unit 3D by the second linear transporter 7.

A film-thickness measuring device 80 is provided adjacent to the transfer robot 22. The wafer is transported, before polishing of the wafer and/or after polishing of the wafer, by the transfer robot 22 to the film-thickness measuring device 80, where the film thickness of the wafer is measured. The film-thickness measuring device 80 may be an optical film-thickness measuring device or an eddy-current film-thickness measuring device. The optical film-thickness measuring device is a device configured to determine a film thickness of a wafer from optical information contained in a reflected light from the wafer. More specifically, the optical film-thickness measuring device is configured to transmit light to a surface of the wafer, resolve the light, reflected from the wafer, according to wavelength, and determine the film thickness based on intensity of the reflected light that has been resolved. The eddy-current film-thickness measuring device is configured to pass a high-frequency alternating current to a coil so as to induce eddy current in a conductive film and detect a thickness of the conductive film from a change in impedance due to a magnetic field produced by the induced eddy current. The film-thickness measuring device 80 may be the optical film-thickness measuring device or the eddy-current film-thickness measuring device using such known technique. The film-thickness measuring device 80 may be other type of film-thickness measuring device.

A buffer stage 72 for the wafer is disposed beside the swing transporter 12. This buffer stage 72 is mounted to a non-illustrated frame. As shown in FIG. 1, the buffer stage 72 is arranged adjacent to the first linear transporter 6 and located between the first linear transporter 6 and the cleaning section 4. The swing transporter 12 is configured to move between the fourth transfer position TP4, the fifth transfer position TP5, and the buffer stage 72. In the above-described embodiment, when the wafer is transported between the polishing units 3A to 3D, the wafer is released from the top ring and is delivered to another polishing unit through the linear transporters 6, 7. It is noted that a mechanism of transporting the wafer between the polishing units is not limited to the above-discussed embodiment. For example, in an embodiment, a top ring, while holding a wafer thereon, may move to another polishing unit to transport the wafer directly to another polishing unit.

The wafer, placed on the buffer stage 72, is transported to the cleaning section 4 by a first transfer robot 77 of the cleaning section 4. As shown in FIG. 1, the cleaning section 4 includes a first cleaning unit 73 and a second cleaning unit 74 for cleaning the polished wafer with a cleaning liquid, and a drying unit 75 for drying the cleaned wafer. The first transfer robot 77 is configured to transport the wafer from the buffer stage 72 to the first cleaning unit 73 and further transport the wafer from the first cleaning unit 73 to the second cleaning unit 74. A second transfer robot 78 is arranged between the second cleaning unit 74 and the drying unit 75. This second transfer robot 78 is operable to transport the wafer from the second cleaning unit 74 to the drying unit 75.

Figure 3:
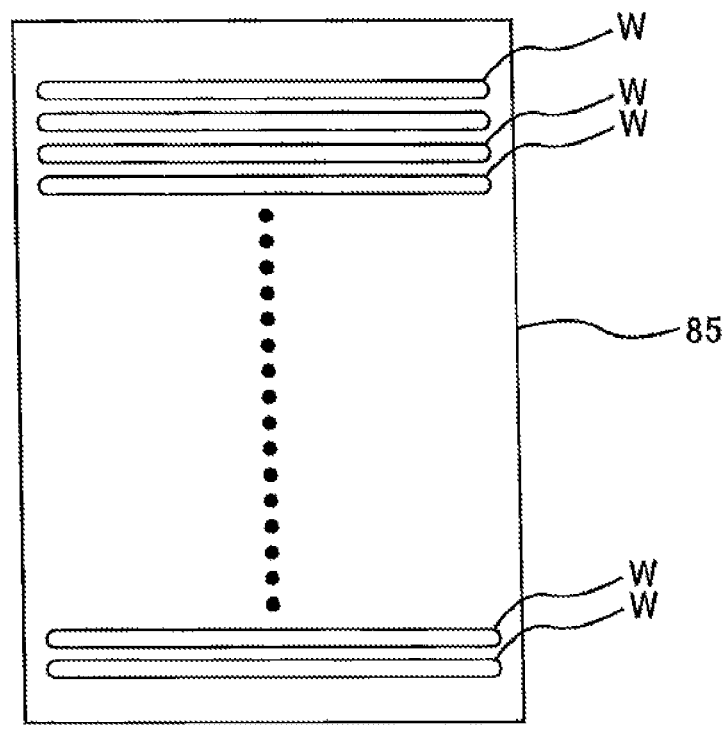
FIG. 3 is a schematic view showing a substrate cassette mounted to a front load section.

FIG. 3 is a schematic view showing the substrate cassette 85 mounted to the front load section 20. As shown in FIG. 3, a plurality of wafers (e.g., twenty-five wafers) are stored in the substrate cassette 85. The transfer robot 22 removes the wafers one by one from the substrate cassette 85, and transports the wafer to the first linear transporter 6. The wafer is transported to one of the polishing units 3A to 3D via the first linear transporter 6 and/or the second linear transporter 7. The wafer is polished in one of the polishing units 3A to 3D. After the wafer is polished in one of the polishing units 3A to 3D, the wafer may be further polished in another one of the polishing units 3A to 3D.

The polished wafer is transported to the first cleaning unit 73 and the second cleaning unit 74 via the first linear transporter 6 and/or the second linear transporter 7, the swing transporter 12, and the transfer robot 77. The polished wafer is then cleaned by the first cleaning unit 73 and the second cleaning unit 74 successively. Further, the cleaned wafer is transported by the transfer robot 78 to the drying unit 75, where the cleaned wafer is dried.

The dried wafer is removed from the drying unit 75 by the transfer robot 22, and then transported to the film-thickness measuring device 80. The film-thickness measuring device 80 measures the film thickness of the polished wafer. Thereafter, the wafer is removed from the film-thickness measuring device 80 by the transfer robot 22 and returned to the substrate cassette 85 on the front load section 20. In this manner, a sequence of processes including polishing, cleaning, drying, and measuring of the film-thickness is performed on the wafer. Before polishing of a wafer, the wafer may be transported to the film-thickness measuring device 80 so that a film thickness of the wafer, to be polished, is measured.

In this embodiment, the transfer robot 22, the first linear transporter 6, the second linear transporter 7, the swing transporter 12, and the transfer robots 77, 78 constitute a transporting device that transports a plurality of wafers, stored in the substrate cassette 85, successively to the polishing units 3A to 3D, and further transports at least one wafer, which has been designated in advance, of the plurality of wafers to the film-thickness measuring device 80. Operation of this transporting device is controlled by the operation controller 5.

FIG. 4 is a diagram showing wafer numbers of respective wafers stored in the substrate cassette 85, and a designation status of each of the wafers with respect to the film-thickness measurement. In FIG. 4, "pre-measurement wafer" represents a wafer whose film thickness is to be measured before polishing of the wafer, "post-measurement wafer" represents a wafer whose film thickness is to be measured after polishing of the wafer, and "non-measurement wafer" represents a wafer whose film thickness is not measured.

Each one of the all waters stored in the substrate cassette 85 is designated in advance as at least one of "pre-measurement wafer", "post-measurement wafer", and "non-measurement wafer". For example, a first wafer shown in FIG. 4 is designated as "pre-measurement wafer" and "post-measurement wafer", a second wafer is designated as "post-measurement wafer", and third, fourth, and fifth wafers are designated as "non-measurement wafer". The first wafer, designated as the pre-measurement wafer and the post-measurement wafer, is transported to the film-thickness measuring device 80 before and after polishing of the first wafer, so that the film thickness of the first wafer is measured. The second wafer, designated as the post-measurement wafer, is transported to the film-thickness measuring device 80 after polishing of the second wafer, so that the film thickness of the second wafer is measured. The third, fourth, and fifth wafers, designated as the non-measurement wafer, are not transported to the film-thickness measuring device 80, and their film thicknesses are not measured.

Designation of the wafers is performed by the operation controller 5. More specifically, the operation controller 5 stores in advance a designation recipe that represents a relationship between the number of each wafer stored in the substrate cassette 85 and a designation type of corresponding wafer. Based on this designation recipe, the operation controller 5 designates each one of the wafers as "pre-measurement wafer (pre-measurement substrate)", "post-measurement wafer (post-measurement substrate)", or "non-measurement wafer (non-measurement substrate)" in accordance with an arrangement order of the wafers stored in the substrate cassette 85. As with the first wafer shown in FIG. 4, one wafer can be designated as both "pre-measurement wafer" and "post-measurement wafer".

FIG. 5 is a diagram showing a wafer processing flow that varies in accordance with a designation status of a wafer. The operation controller 5 judges whether or not a wafer is designated as the pre-measurement wafer (step 1). If the wafer is designated as the pre-measurement wafer, the operation controller 5 judges whether or not the wafer has already been polished (step 2). If the wafer has not been polished yet, the wafer is transported to the film-thickness measuring device 80, where a film thickness of the wafer before polishing is measured.

If the wafer is not designated as the pre-measurement wafer in the step 1 and if the wafer has already been polished in the step 2, the operation controller 5 judges whether or not the wafer is designated as the post-measurement wafer (step 3). If the wafer is designated as the post-measurement wafer, the operation controller 5 judges whether or not the wafer has already been polished (step 4). If the wafer has already been polished, the wafer is transported to the film-thickness measuring device 80, where a film thickness of the wafer after polishing is measured. If the wafer has not been polished yet, the processing flow is terminated.

If the wafer is not designated as the post-measurement wafer in the step 3, the operation controller 5 judges whether or not the wafer is designated as the non-measurement wafer (step 5). If the wafer is not designated as the non-measurement wafer, the processing flow is terminated. If the wafer is designated as the non-measurement wafer, the operation controller 5 judges whether or not the wafer has already been polished (step 6). If the wafer has not been polished yet, the processing flow is terminated. If the wafer has already been polished, the operation controller 5 judges whether or not a polishing error has occurred during polishing of the wafer designated as the non-measurement wafer (step 7).

The polishing error is a polishing failure that has occurred during polishing of a wafer in one of the polishing units 3A, 3B, 3C, and 3D. The polishing error is detected by a polishing error detector 90 shown in FIG. 1. This polishing error detector 90 is coupled to the polishing units 3A, 3B, 3C, and 3D and the operation controller 5. The polishing error detector 90 is configured to detect the polishing error that has occurred during polishing of a wafer, and transmit a polishing error signal to the operation controller 5. Examples of the polishing error include an abnormal load of pressing the wafer against the polishing pad, an abnormal flow rate of the polishing liquid (slurry) supplied onto the polishing pad, or a detection failure of the polishing end point of a wafer. For example, if the flow rate of the polishing liquid has reached a predetermined threshold value, the polishing error detector 90 transmits the polishing error signal to the operation controller 5.

If the polishing error has occurred during polishing of a wafer designated as the non-measurement wafer in the step 7, i.e., if the operation controller 5 receives the polishing error signal from the polishing error detector 90, that wafer is transported to the film-thickness measuring device 80, where a film thickness of the polished wafer is measured. More specifically, after polishing of the wafer is terminated, the wafer is transported to the first cleaning unit 73 and the second cleaning unit 74 in this order, so that the wafer is cleaned. Further, the cleaned wafer is dried by the drying unit 75. Thereafter, the dried wafer is transported to the film-thickness measuring device 80, where its film thickness is measured. In this manner, the film-thickness measuring device 80 can measure the film thickness accurately, because the wafer is cleaned and dried before the wafer is transported to the film-thickness measuring device 80.

In this embodiment, the film thickness of the wafer is measured in the film-thickness measuring device 80 before the dried wafer is returned to the substrate cassette 85. In another embodiment, the film thickness of the wafer may be measured in the film-thickness measuring device 80 after the dried wafer is returned to the substrate cassette 85.

If the polishing error has not occurred during polishing of the wafer designated as the non-measurement wafer in the step 7, the processing flow is terminated. After the film thicknesses of the post-measurement wafer and the film thicknesses of the non-measurement wafer are measured in the film-thickness measuring device 80, the operation controller 5 receives measurement data from the film-thickness measuring device 80 and checks a validity of the measurement data (step 8). A validity value, which indicates the validity of the measurement data (i.e., film-thickness measured values) of the film thickness (i.e., the validity of measurement results), is appended to the measurement data transmitted from the film-thickness measuring device 80. This validity value is an index value that represents validity or reliability of measured value of the film thickness, and is produced by the film-thickness measuring device 80. The operation controller 5 determines whether or not the measurement data (the measured values of the film thickness) are valid based on the validity index value. If the measurement data are determined to be valid, the processing flow of the wafer is terminated. If the measurement data are determined to be not valid, the film thickness of the wafer is measured again by the film-thickness measuring device 80, and the operation controller 5 receives the measurement data again.

Fifteen wafers of twenty-five wafers stored in the substrate cassette 85 are designated as the non-measurement wafers, if the polishing error has occurred during polishing of any one of these fifteen non-measurement wafers, that wafer is transported to the film-thickness measuring device 80 and the film thickness of that wafer is measured, even though the wafer is designated as the non-measurement wafer. In this manner, a film thickness of a wafer is measured even if that wafer is designated as the non-measurement wafer. Therefore, it is possible to judge whether re-polishing of the wafer is necessary or not. As a result, scrapping of the wafer can be avoided.

The processing flow shown in FIG. 5 is performed twice, i.e., before and after polishing of a wafer. More specifically, the processing flow is performed before removing a wafer from the load-unload section 2, and the processing flow is performed again after polishing, cleaning, and drying of the wafer (i.e., before the transfer robot 22 removes the wafer from the drying unit 75).

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing method comprising:
    polishing a plurality of substrates including at least one post-measurement substrate designated as a substrate whose film thickness is to be measured after polishing and at least one non-measurement substrate designated as a substrate whose film thickness is not measured;
    measuring a film thickness of the at least one post-measurement substrate after polishing of the at least one post-measurement substrate;
    detecting that a polishing error has occurred during polishing of the at least one non-measurement substrate;
    thereafter, measuring a film thickness of the at least one non-measurement substrate after polishing of the at least one non-measurement substrate; and
    determining whether re-polishing is necessary.

2. The polishing method according to claim 1, further comprising:
    cleaning the plurality of substrates that have been polished; and
    drying the plurality of substrates that have been cleaned.

3. The polishing method according to claim 1, wherein whether or not the polishing error has occurred is judged after the at least one non-measurement substrate is polished.

4. A polishing apparatus comprising:
    a polishing unit configured to polish a plurality of substrates, including at least one post-measurement substrate designated as a substrate whose film thickness is to be measured after polishing and at least one non-measurement substrate designated as a substrate whose film thickness is not measured;
    a film-thickness measuring device configured to measure a film thickness of the at least one post-measurement substrate that has been polished;
    a polishing error detector configured to detect that a polishing error has occurred during polishing of the at least one non-measurement substrate;
    a transporting device configured to transport the plurality of substrates successively to the polishing unit, and further transport the at least one post-measurement substrate to the film-thickness measuring device, the transporting device being configured to transport the at least one non-measurement substrate to the film-thickness measuring device after the polishing error detector detects that a polishing error occurred; and
    determining whether re-polishing is necessary.

5. The polishing apparatus according to claim 4, further comprising:
    a cleaning unit configured to clean a substrate; and
    a drying unit configured to dry a substrate.

6. The polishing method according to claim 1, further comprising:
    designating each one of the plurality of substrates as a pre-measurement substrate, a post-measurement substrate, or a non-measurement substrate, the pre-measurement substrate being a substrate whose film thickness is to be measured before polishing, the post-measurement substrate being a substrate whose film thickness is to be measured after polishing, and the non-measurement substrate being a substrate whose film thickness is not measured.

7. The polishing method according to claim 1, further comprising:
    determining whether a measured value of the film thickness of the at least one post-measurement substrate is valid or not.

8. The polishing method according to claim 7, further comprising:
    if the measured value is not valid, measuring the film thickness of the at least one post-measurement substrate again.

9. The polishing method according to claim 1, further comprising:
    determining whether a measured value of the film thickness of the at least one non-measurement substrate is valid or not.

10. The polishing method according to claim 9, further comprising:
    if the measured value is not valid, measuring the film thickness of the at least one non-measurement substrate again.

11. The polishing method according to claim 1, wherein the polishing error includes at least one of an abnormal load of pressing the at least one non-measurement substrate against a polishing pad, an abnormal flow rate of a polishing liquid supplied onto the polishing pad, and a detection failure of a polishing end point of the at least one non-measurement substrate.

12. The polishing method according to claim 4, wherein the polishing error includes at least one of an abnormal load of pressing the at least one non-measurement substrate against a polishing pad, an abnormal flow rate of a polishing liquid supplied onto the polishing pad, and a detection failure of a polishing end point of the at least one non-measurement substrate.

* * * * *